US012581673B2

(12) United States Patent
Li et al.

(10) Patent No.: US 12,581,673 B2
(45) Date of Patent: Mar. 17, 2026

(54) SCHOTTKY DIODE AND METHOD FOR FORMING THE SAME

(71) Applicant: TAIWAN SEMICONDUCTOR MANUFACTURING COMPANY LTD., Hsinchu (TW)

(72) Inventors: Guan-Yi Li, New Taipei (TW); Chia-Cheng Ho, Hsinchu (TW); Chan-Yu Hung, Tainan (TW); Fei-yun Chen, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 489 days.

(21) Appl. No.: 18/155,054

(22) Filed: Jan. 16, 2023

(65) Prior Publication Data

US 2024/0097051 A1     Mar. 21, 2024

Related U.S. Application Data

(60) Provisional application No. 63/375,897, filed on Sep. 16, 2022.

(51) Int. Cl.
| | |
|---|---|
| H10D 8/60 | (2025.01) |
| H10D 62/10 | (2025.01) |
| H10D 64/00 | (2025.01) |

(52) U.S. Cl.
CPC ........... H10D 8/605 (2025.01); H10D 62/107 (2025.01); H10D 64/117 (2025.01)

(58) Field of Classification Search
CPC .... H10D 8/605; H10D 62/107; H10D 64/117;

H10D 8/60; H10D 8/051; H10D 62/106; H10D 62/83; H10D 64/111; H10D 64/62; H10D 62/114; H10D 84/811
See application file for complete search history.

(56) References Cited

U.S. PATENT DOCUMENTS

| | | | | |
|---|---|---|---|---|
| 11,121,253 B2 * | 9/2021 | Chung | ............... | H10D 30/0221 |
| 11,152,506 B1 * | 10/2021 | Chuang | ............... | H10D 64/111 |
| 11,515,398 B2 * | 11/2022 | Kuo | ................... | H10D 30/0221 |

(Continued)

OTHER PUBLICATIONS

Yang, Fu-Jen, et al. "RESURF pn Diode With a Buried Layer, a Comprehensive Study." IEEE transactions on electron devices 60.11 (2013): 3835-3841.

*Primary Examiner* — Steven B Gauthier
*Assistant Examiner* — Khatib A Rahman
(74) *Attorney, Agent, or Firm* — WPAT LAW; Anthony King

(57) ABSTRACT

A Schottky diode includes a substrate, a first drift region in the substrate, a second drift region in the substrate, a first dielectric layer disposed over the substrate, a first doped region in the first drift region, a second doped region in the second drift region, a third doped region in the first drift region, and a metal field plate disposed over the first dielectric layer. The first drift region and the first doped region include a first conductivity type. The second drift region, the second doped region and third doped region include a second conductivity type complementary to the first conductivity type. The first dielectric layer overlaps a portion of the first drift region and a portion of the second drift region. The second doped region is separated from the first doped region.

20 Claims, 14 Drawing Sheets

(56)     References Cited

U.S. PATENT DOCUMENTS

| | | | |
|---|---|---|---|
| 12,205,996 B2 * | 1/2025 | Jin ........................ | H10D 30/603 |
| 2012/0228704 A1 * | 9/2012 | Ju .......................... | H10D 30/65 |
| | | | 257/E29.256 |
| 2014/0197489 A1 * | 7/2014 | Chu ..................... | H10D 62/158 |
| | | | 438/286 |

* cited by examiner

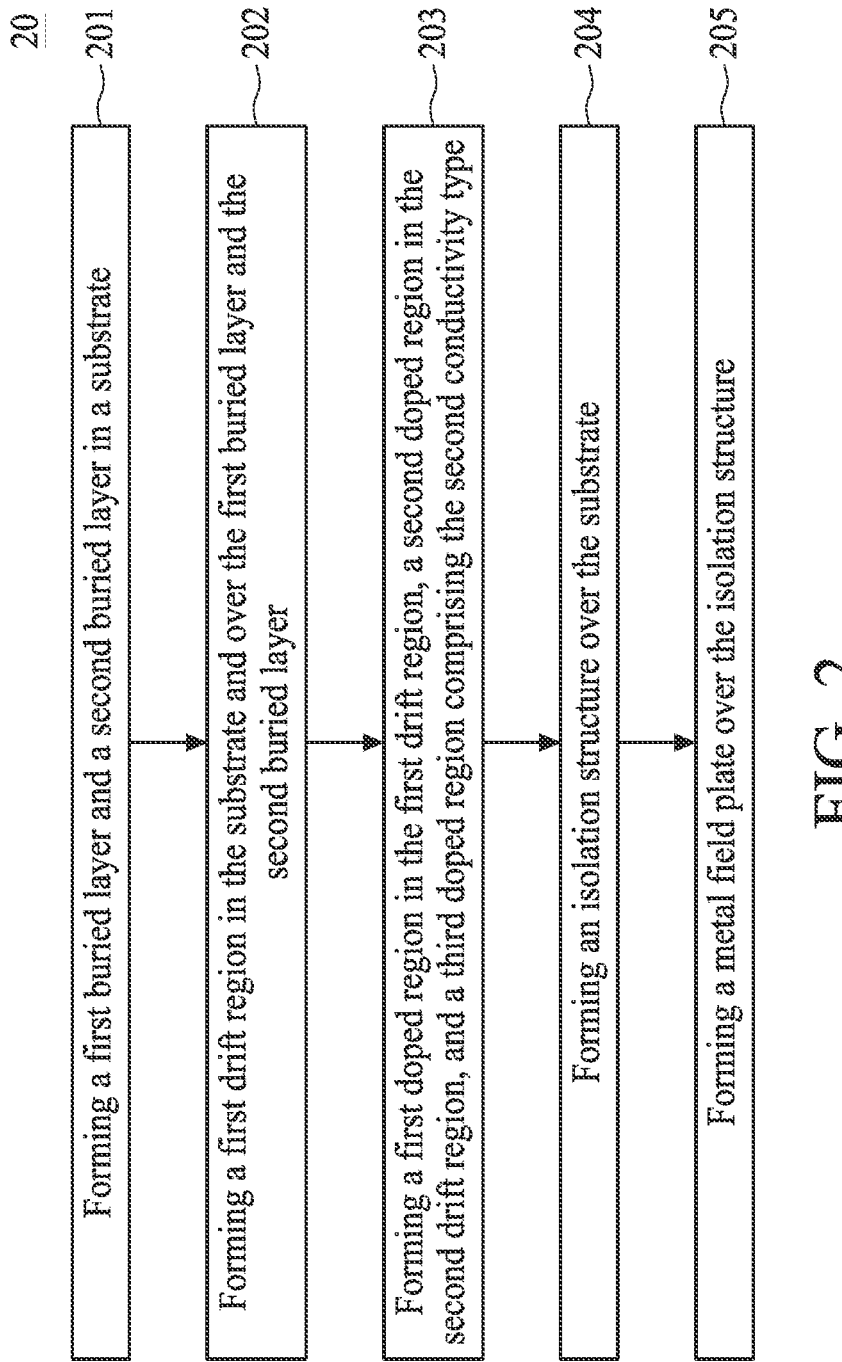

20

201 — Forming a first buried layer and a second buried layer in a substrate

202 — Forming a first drift region in the substrate and over the first buried layer and the second buried layer 203 — Forming a first doped region in the first drift region, a second doped region in the second drift region, and a third doped region comprising the second conductivity type 204 — Forming an isolation structure over the substrate 205 — Forming a metal field plate over the isolation structure

FIG. 2

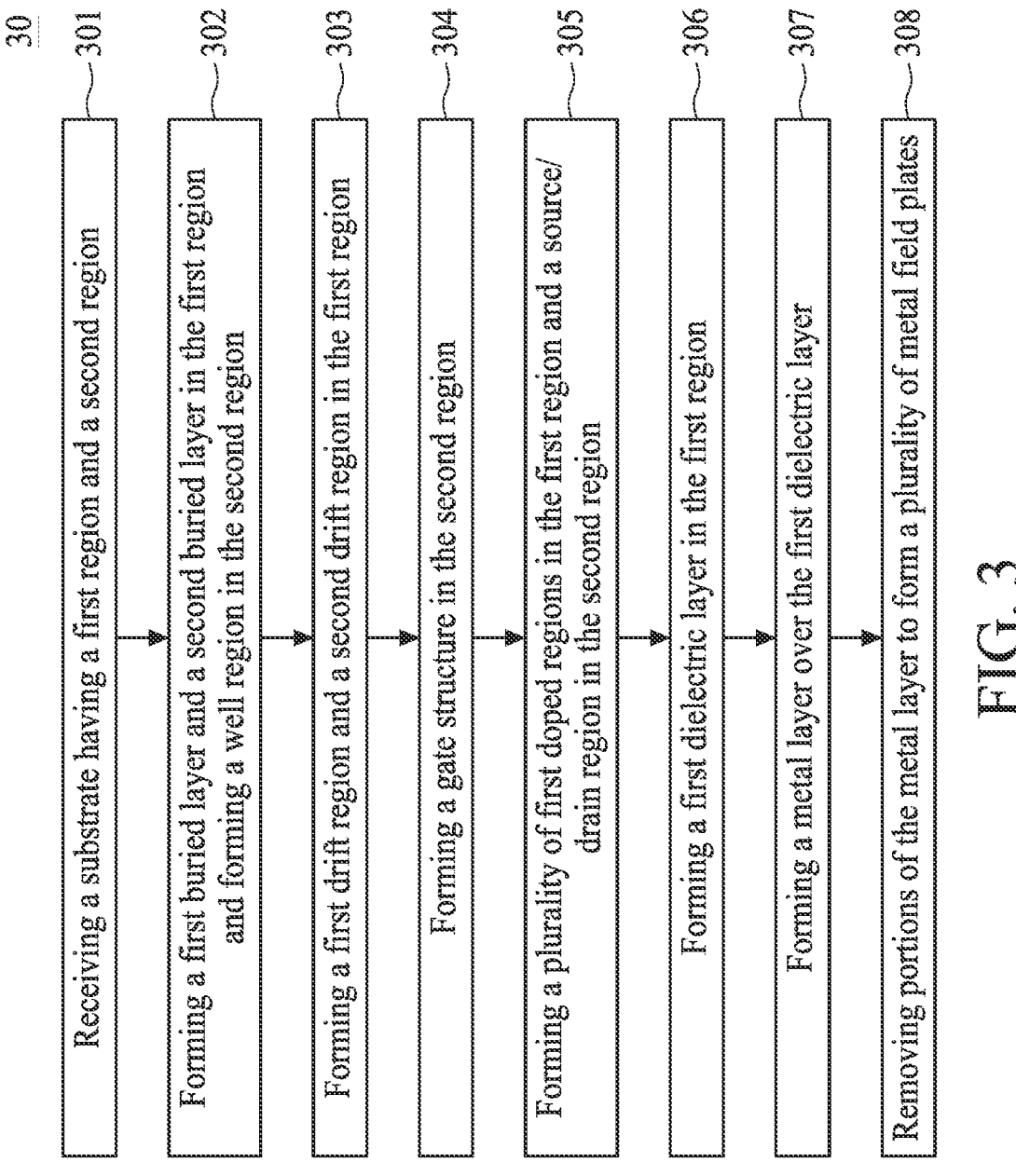

30

301 Receiving a substrate having a first region and a second region

302 Forming a first buried layer and a second buried layer in the first region and forming a well region in the second region 303 Forming a first drift region and a second drift region in the first region 304 Forming a gate structure in the second region 305 Forming a plurality of first doped regions in the first region and a source/drain region in the second region 306 Forming a first dielectric layer in the first region 307 Forming a metal layer over the first dielectric layer 308 Removing portions of the metal layer to form a plurality of metal field plates

FIG. 3

SCHOTTKY DIODE AND METHOD FOR FORMING THE SAME

PRIORITY CLAIM AND CROSS-REFERENCE

This application claims the benefit of prior-filed provisional application No. 63/375,897, filed on Sep. 16, 2022.

BACKGROUND

A Schottky diode is an important power device featuring a metal-semiconductor junction that creates a Schottky barrier for the purpose of rectification for an extended period of time. With characteristics of high switching speed and rectification, the Schottky diode has been widely applied to high-speed switching power devices, digital computers and output regulators.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 is a flowchart representing a method for forming a Schottky diode according to aspects of the present disclosure.

FIG. 3 is a flowchart representing a method for forming a semiconductor structure including a Schottky diode according to aspects of the present disclosure.

DETAILED DESCRIPTION

Figure 1:
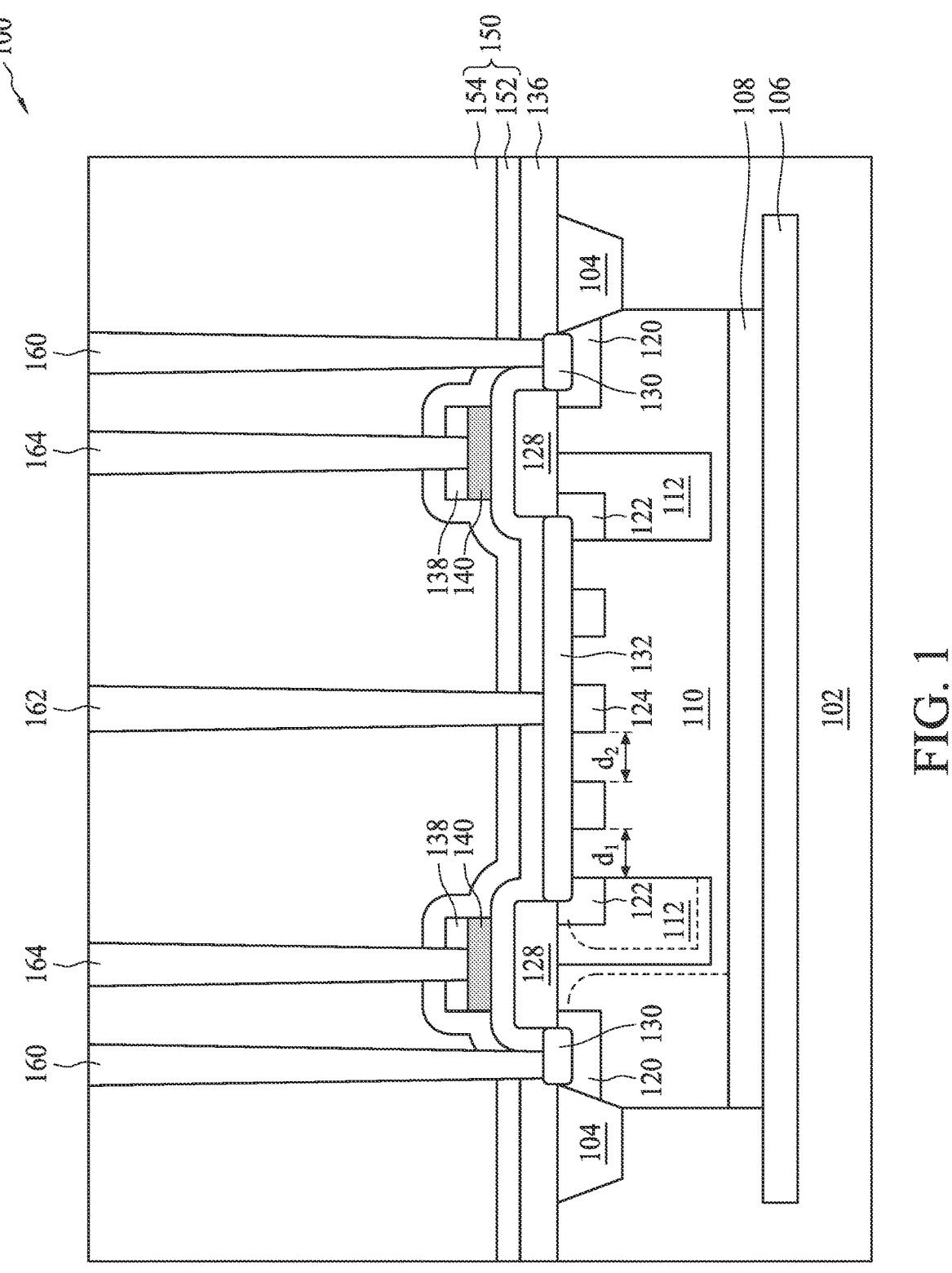
FIG. 1 is a schematic drawing illustrating a Schottky diode.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

High voltage (HV) Schottky diodes are commonly used in various circuit applications that require high breakdown voltage and high switch frequency. In some comparative approaches, the HV Schottky diode is integrated with another device such as a complementary metal-oxide-semiconductor (CMOS) device and/or a diffused metal-oxide-semiconductor (DMOS) transistor device. In such approaches, the integrated Schottky diode has a Schottky barrier junction made of a metal layer and an N-drift region. Further, the Schottky diode may include a metal-semiconductor structure over a dielectric layer serving as a reduced surface field (RESURF) structure. In such approaches, it is found that the HV Schottky diode occupies a greater area in order to provide greater depletion region to increase the breakdown voltage. In other comparative approaches, a P-doped buried layer is formed in an N-draft region and serves as a RESURF structure for increasing the breakdown voltage. However, the forming of the P-doped buried layer makes the manufacturing operations more complicated.

According to one embodiment of the present disclosure, a semiconductor structure including a Schottky diode is provided. In some embodiments, the Schottky diode includes a metal field plate that is able to reduce surface electric fields. Due to the reduced surface electric field, a breakdown voltage of the Schottky diode is increased. Further, the metal field plate allows a full depletion region to be formed before the surface electric field exceeds a critical field. Therefore, an area occupied by the Schottky diode can be reduced, and an on resistance is reduced.

Please refer to FIG. 1, which is a schematic drawing illustrating a Schottky diode 100 according to embodiments of the present disclosure. In some embodiments, the Schottky diode 100 includes a substrate 102, such as a semiconductor substrate. The semiconductor substrate 102 may include an elementary semiconductor including silicon or germanium in crystal, polycrystalline, or amorphous structure; a compound semiconductor including silicon carbide, gallium arsenic, gallium phosphide, indium phosphide, indium arsenide, or indium antimonide; an alloy semiconductor including SiGe, GaAsP, AlInAs, AlGaAs, GaInAs, GaInP, and GaInAsP; or any other suitable material; or a combination thereof. In some embodiments, the alloy semiconductor substrate may have a gradient SiGe feature in which the Si and Ge composition changes from one ratio at one location to another ratio at another location of the gradient SiGe feature. In other embodiments, the alloy SiGe is formed over a silicon substrate. In other embodiments, a SiGe substrate is strained. Furthermore, the semiconductor substrate may be a semiconductor on insulator, such as a silicon on insulator (SOI). In some examples, the semiconductor substrate may include a doped epi-layer or a buried layer. In other examples, the compound semiconductor substrate may have a multilayer structure, or the substrate may include a multilayer compound semiconductor structure.

The Schottky diode 100 includes an isolation structure 104 disposed in the substrate 102. In some embodiments, the isolation structure 104 is a shallow trench isolation (STI) structure, but the disclosure is not limited thereto. In some embodiments, a depth of the isolation structure 104 is between approximately 300 nanometers and approximately 400 nanometers, but the disclosure is not limited thereto. In some embodiments, the isolation structure 104 may have a ring shape that defines a location and an area where the Schottky diode 100 is accommodated.

The Schottky diode 100 includes a first buried layer 106 and a second buried layer 108 disposed in the substrate 102. The first buried layer 106 includes a first conductivity type, the second buried layer 108 includes a second conductivity type, and the first conductivity type and the second conductivity type are complementary to each other. In some embodiments, the first conductivity type is an n-type, and the second conductivity type is a p-type. In such embodiments, the first buried layer 106 can be referred to as an n-buried layer (NBL) and the second buried layer 108 can be referred to as a p-buried layer (PBL). In some embodiments, portions of the first buried layer 106 are overlapped by the isolation structure 104, but the disclosure is not limited thereto. In some embodiments, the second buried layer 108 is entirely surrounded by the ring-shaped isolation structure 104, but the disclosure is not limited thereto.

Still referring to FIG. 1, the Schottky diode 100 includes a first drift region 110 and a second drift region 112. In some embodiments, both of the first and second buried layers 106 and 108 are disposed under the first and second drift regions 110 and 112. Further, the second buried layer 108 is disposed between the first buried layer 106 and the first drift region 110. A width of the first drift region 110 may be equal to a width of the second buried layer 108, but the disclosure is not limited thereto. In some embodiments, the first drift region 110 is surrounded by the ring-shaped isolation structure 104. The second drift region 112 is disposed in the first drift region 110. Further, the second drift region 112 is separated from the second buried layer 108 and the isolation structure 104 by the first drift region 110. In some embodiments, the second drift region 112 may have a ring shape. The first drift region 110 includes the first conductivity type, and the second drift region 112 includes the second conductivity type. In some embodiments, the first drift region 110 is an n-typed region, and the second drift region 112 is a p-type region. In such embodiments, the first drift region 110 is referred to as a high-voltage n-well (HVNW). In some embodiments, the first and second drift regions 110 and 112 provide a full depletion such that a leakage current is reduced at an off state.

The Schottky diode 100 includes a doped region 120 disposed in the first drift region 110. The doped region 120 include the first conductivity type. Further, a concentration of the doped region 120 is greater than a concentration of the first drift region 110. In some embodiments, the doped region 120 has a ring shape. In such embodiments, the ring-shaped doped region 120 surrounds the ring-shaped second drift region 112, and the ring-shaped isolation structure 104 surrounds the ring-shaped doped region 120. In some embodiments, the doped region 120 abuts the isolation structure 104, but the disclosure is not limited thereto.

The Schottky diode 100 includes another doped region 122 disposed in the second drift region 112. The doped region 122 includes the second conductivity type. Further, a concentration of the doped region 122 is greater than a concentration of the second drift region 112. The doped region 122 is separated from the doped region 120 by the first drift region 110 and the second drift region 112. In some embodiments, a bottom and at least a sidewall of the doped region 122 are in contact with the second drift region 112, but the disclosure is not limited thereto. In some embodiments, the doped region 122 also has a ring shape.

In some embodiments, the Schottky diode 100 includes further doped regions 124 disposed in the first drift region 110. The doped regions 124 include the second conductivity type. In some embodiments, a concentration of the doped region 124 is greater than the concentration of the second drift region 112. In some embodiments, the concentration of the doped region 124 is equal to the concentration of the doped region 122. As shown in FIG. 1, the doped regions 124 are separated from each other by the first drift region 110. Further, the doped regions 124 are separated from the doped region 122 by the first drift region 110. In some embodiments, a distance d1 between the adjacent doped regions 122 and 124 is equal to a distance d2 between the adjacent doped regions 124, but the disclosure is not limited thereto. In some embodiments, a depth of the doped region 120, a depth of the doped region 122 and depths of the doped regions 124 are equal, but the disclosure is not limited thereto. In some embodiments, the doped regions 124 and the first drift region 110 together provide a full depletion, and thus the leakage current is further reduced in the off state.

The Schottky diode 100 includes a silicide layer 130 disposed over the doped region 120 and a silicide layer 132 disposed over the doped regions 122 and 124 and the first drift region 110. The silicide layer 130 on the ring-shaped doped region 120 obtains a ring shape. The silicide layer 130 is in contact and electrically connected to the doped region 120, and the silicide layer 132 is in contact and electrically connected to the doped region 122, the doped regions 124 and the first drift region 110.

The Schottky diode 100 further includes a dielectric layer 128 disposed over the substrate 102 and separating the silicide layer 130 and the silicide layer 132. In some embodiments, the dielectric layer 128 has a ring shape and is disposed between the silicide layers 130 and 132. Further, the dielectric layer 128 overlaps a portion of the doped region 120, a portion of the first drift region 110, a portion of the second drift region 112, and a portion of the doped region 122. In some embodiments, the Schottky diode 100 further includes a dielectric layer 136 disposed over the dielectric layer 128. The dielectric layer 136 may extend along the surface of the substrate 102. In some embodiments, the dielectric layer 136 covers the dielectric layer 128, the silicide layer 130, the silicide layer 132, and the isolation structure 104. In some embodiments, the dielectric layer 136 is in contact with a top surface and sidewalls of the dielectric layer 128. The dielectric layers 128 and 136 include different dielectric materials. In some embodiments, a sum of a thickness of the dielectric layer 128 and a thickness of the dielectric layer 136 may be between approximately 50 nanometers and approximately 150 nanometers, but the disclosure is not limited thereto.

The Schottky diode 100 includes a metal field plate 140 disposed over the dielectric layers 136 and 128. Further, the metal field plate 140 is separated from the dielectric layer 128 by the dielectric layer 136. In other words, the dielectric layer 136 is disposed between the metal field plate 140 and the dielectric layer 128. In some embodiments, the metal field plate 140 includes a ring shape. In some embodiments, a width of the metal field plate 140 is less than a width of the dielectric layer 128, but the disclosure is not limited thereto.

In some embodiments, the Schottky diode 100 further includes another dielectric layer 138 disposed over the metal field plate 140. A width of the dielectric layer 138 may be equal to the width of the metal field plate 140. The dielectric layer 138 may be used to define a location and the width of the metal field plate 140. Such details are described below.

In some embodiments, the Schottky diode 100 includes a dielectric structure 150 disposed over the substrate 102. In some embodiments, the dielectric structure 150 includes a multiple layered structure. For example, the dielectric layer 150 may include a contact etch-stop layer (CESL) 152 and an inter-layer dielectric (ILD) layer 154. In some embodiments, the CESL 152 can include silicon nitride, silicon oxynitride, and/or other applicable materials. In some embodiments, the ILD layer 154 itself may include multi-layers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), and polyimide.

In some embodiments, a plurality of connecting plugs 160, 162 and 164 are formed in the dielectric structure 150. Further, the connecting plugs 160, 162 and 164 penetrate the dielectric structure 150 (i.e., the ILD layer 154 and the CESL 152). As shown in FIG. 1, the connecting plug 160 is in contact with the silicide layer 130 and electrically connected to the doped region 120 through the silicide layer 130. The connecting plug 162 is in contact with the silicide layer 132 and thus electrically connected to the doped region 122, the first drift region 110 and the doped regions 124. In some embodiments, the connecting plug 160 electrically connects the doped region 120 to a cathode, while the connecting plug 162 electrically connects the doped region 122, the first drift region 110 and the doped regions 124 to an anode. In some embodiments, the connecting plug 164 further penetrates the dielectric layer 138 and is in contact with the metal field plate 140. Accordingly, the connecting plug 164 electrically connects the metal field plate 140 to a voltage.

In some embodiments, in an on state, a voltage may be applied to the metal field plate 140, thereby generating an electrical field. As shown in FIG. 1, in some embodiments, the depletion region formed by the n-drift region 110 and the p-drift region 112 may be enlarged near the dielectric layer 134 due to the electrical field generated by the metal field plate 140. The enlargement is depicted by the dotted line in FIG. 1. Further, by adjusting the thickness of the dielectric layer 128, the thickness of the dielectric layer 136 and the magnitude of the voltage applied to the metal field plate 140, a strength of the electrical field and the enlargement of the depletion region can be modified. More importantly, the enlargement of a depletion region helps increase the breakdown voltage at the on state. In some embodiments, a breakdown voltage of the Schottky diode 100 can be increased to greater than approximately 24V. In contrast, a Schottky diode without the metal field plate 140 may need more space between the n-drift region 110 and the p-drift region 112 to achieve the enlargement to the depletion region. Thus, such Schottky diode is not able to easily scale down.

Thus, due to the inclusion of the metal field plate 140, the Schottky diode 100 can be easily scaled down with an increased breakdown voltage. Accordingly, a shorter current path can be found in the Schottky diode 100 including the metal field plate, and a resistivity of the Schottky diode 100 is reduced. In some embodiments, the resistivity of the Schottky diode 100 can be reduced to less than 100 μΩcm. In contrast, a Schottky diode without the metal field plate 140 requires an extra-heavily-doped region to achieve such resistivity reduction. In such comparative approaches, manufacturing of such Schottky diode is excessively complicated.

FIG. 2 is a flowchart representing a method 20 for forming a Schottky diode according to aspects of the present disclosure. The method 20 includes a number of operations (201, 202, 203, 204 and 205). The method 20 will be further described according to one or more embodiments. It should be noted that the operations of the method 20 may be rearranged or otherwise modified within the scope of the various aspects. It should be further noted that additional processes may be provided before, during, or after the method 20, and that some other processes may be only briefly described herein. Thus, other implementations are possible within the scope of the various aspects described herein.

FIG. 3 is a flowchart representing a method 30 for forming a semiconductor structure including a Schottky diode according to aspects of the present disclosure. The method 30 includes a number of operations (301, 302, 303, 304, 305, 306, 307 and 308). The method 30 will be further described according to one or more embodiments. It should be noted that the operations of the method 30 may be rearranged or otherwise modified within the scope of the various aspects. It should be further noted that additional processes may be provided before, during, or after the method 30, and that some other processes may be only briefly described herein. Thus, other implementations are possible within the scope of the various aspects described herein. In some embodiments, the method 30 can be integrated in the method 20, but the disclosure is not limited thereto.

Figure 4:
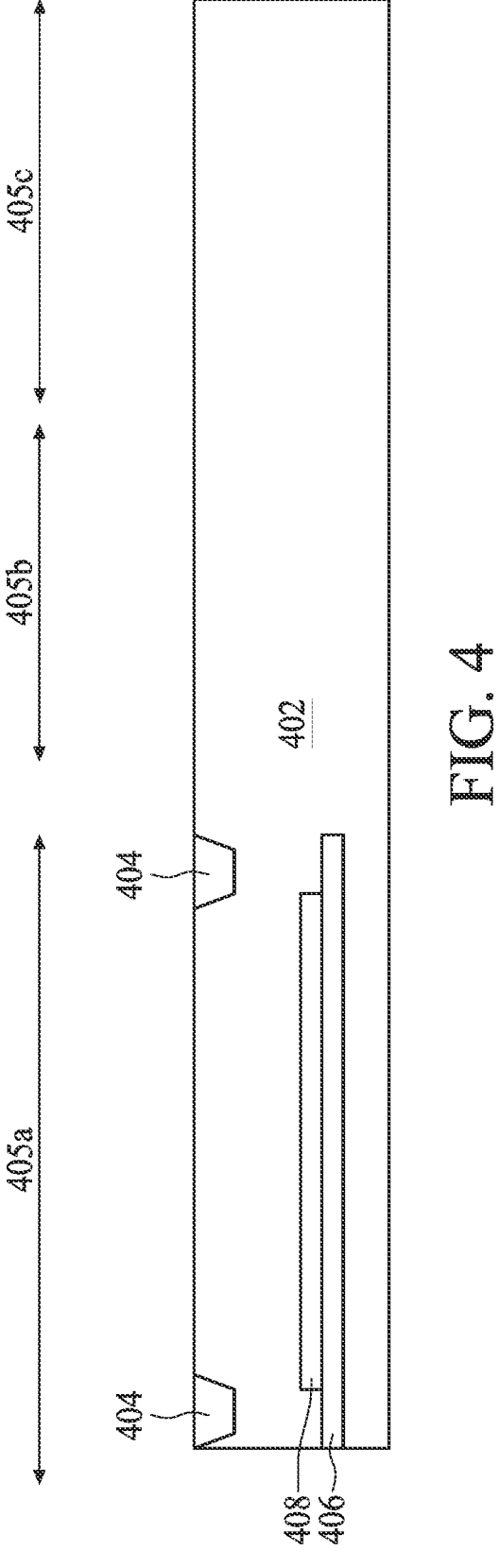
FIGS. 4 to 14 are schematic drawings of a semiconductor structure including a Schottky diode at various fabrication stages according to aspects of the present disclosure in one or more embodiments.

Referring to FIG. 4, in some embodiments, in operation 301, a substrate 402 is received. In some embodiments, the substrate 402 can include a material same as that of the substrate 102; therefore, such details are omitted for brevity. In some embodiments, isolation structures 404 are formed in the substrate 402. The isolation structures 404 include dielectric materials such as silicon oxide, silicon nitride, silicon oxynitride, other suitable materials, or combinations thereof. In some embodiments, the isolation structures 404 are multi-layered structures. The isolation structures 404 may be deposited by CVD, ALD, or any other suitable technique. A chemical mechanical polishing (CMP) operation may be performed after the formation of the isolation structures 404 to remove superfluous dielectric material, and also to provide a substantially planar and even surface.

The isolation structures 404 may be formed to define regions where devices are to be formed. For example, the isolation structure 404 may define a first region 405a used to accommodate a Schottky diode. Further, the isolation structure 404 defines a location and a size of the Schottky diode. In some embodiments, the isolation structure 404 has a ring shape, but the disclosure is not limited thereto. In some embodiments, the isolation structures 404 may be formed to define other regions such as a second region 405b and a third region 405c. The second region 405b may be used to accommodate a CMOS device, while the third region 405c may be used to accommodate a DMOS device, but the disclosure is not limited thereto. Further, the isolation structures 404 may be formed in the second and third regions 405b and 405c to define locations and sizes of the devices to be formed in the second and third regions 405b and 405c, though not shown.

In some embodiments, in operation 201 and operation 302, a first buried layer 406 and a second buried layer 408 are formed in the substrate 402. As shown in FIG. 4, the first buried layer 406 and the second buried layer 408 are both formed in the first region 405a. The first buried layer 406 includes a first conductivity type, and the second buried layer 408 includes a second conductivity type complementary to the first conductivity type. In some embodiments, the first conductivity type is an n-type, and the second conductivity type is a p-type, but the disclosure is not limited thereto. In such embodiments, the first buried layer 406 may be referred to as an NBL, and the second buried layer 408 may be referred to as a PBL. As shown in FIG. 4, the second buried layer 408 is formed over the first buried layer 406. Further, the second buried layer 408 may be surrounded by the ring-shaped isolation structure 404. In some embodiments, an area of the underlying first buried layer 406 is greater than an area of the second buried layer 408. In some embodiments, the first buried layer 406 may be overlapped by the ring-shaped isolation structure 404, but the disclosure is not limited thereto.

In some embodiments, a well region (not shown) is formed in the second region 405b and/or the third region 405c in operation 302. The well region may include the first conductivity type or the second conductivity type, depending on product designs for the devices to be formed.

Figure 5:
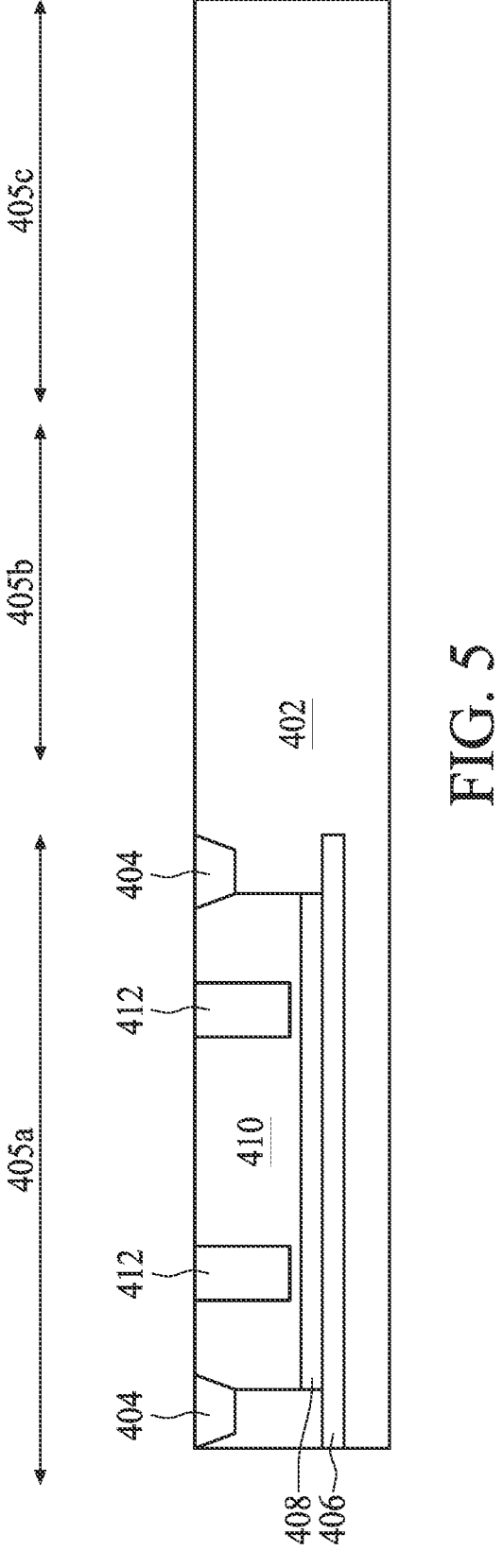

Referring to FIG. 5, in operation 202 and operation 303, a first drift region 410 and a second drift region 412 are formed in the substrate 402. Further, the first and second drift regions 410 and 412 are both formed in the first region 405a. As shown in FIG. 5, the first drift region 410 is formed over the second buried layer 408. In other words, the first drift region 410 is separated from the first buried layer 406 by the second buried layer 408. In some embodiments, the first drift region 410 is surrounded by the ring-shaped isolation structure 404, but the disclosure is not limited thereto. The second drift region 412 is formed in the first drift region 410. In some embodiments, the second drift region 412 has a ring shape. In such embodiments, the ring-shaped isolation structure 404 surrounds the ring-shaped second drift region 412. However, the isolation structure 404 is separated from the second drift region 412 by the first drift region 410. The first drift region 410 includes the first conductivity type, and the second drift region 412 includes the second conductivity type. In such embodiments, the first drift region 410 is an n-drift region, and the second drift region 412 is a p-drift region.

In some embodiments, other well regions may be formed in the second region 405b and/or the third region 405c, though not shown. The well regions may include the first or second conductivity types, depending on designs for the devices to be formed. In some embodiments, the operation 302 and the operation 303 indicate that the method 30 can be easily integrated into operations for forming well regions in a MOS manufacturing process.

Figure 6:
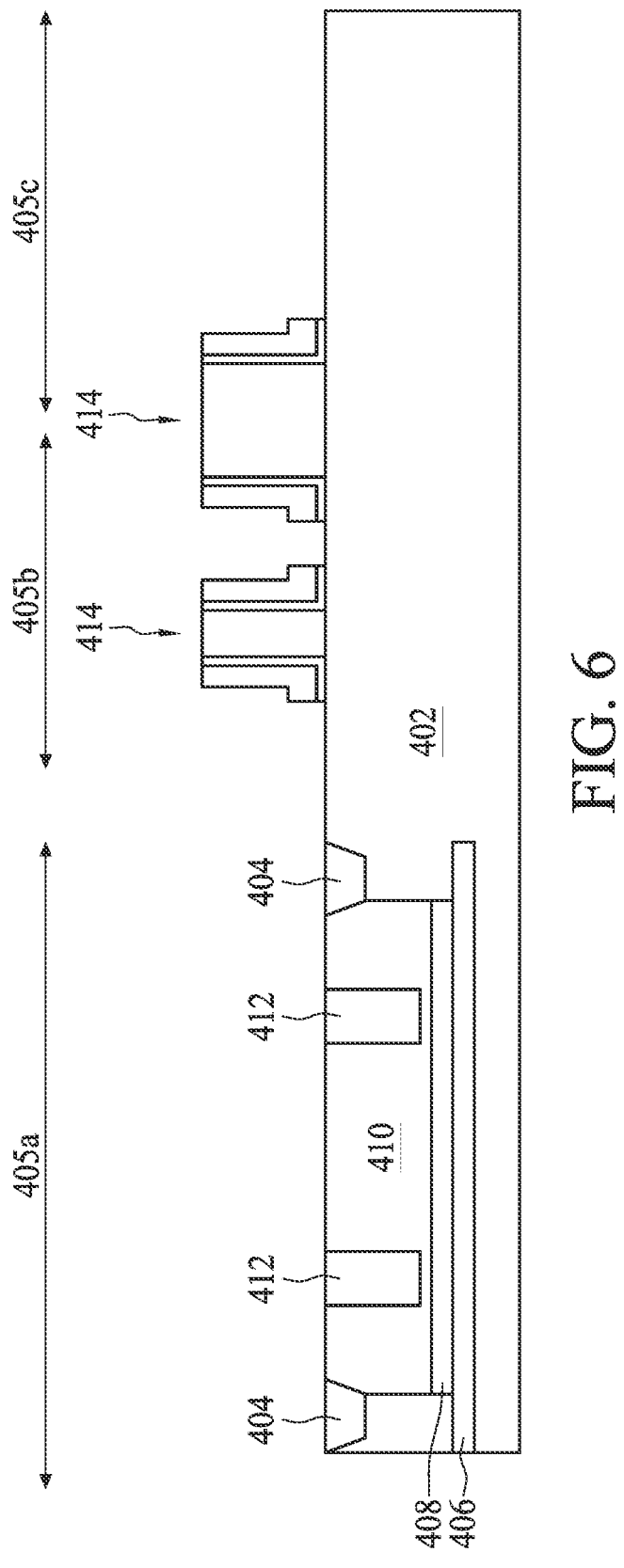

Referring to FIG. 6, in operation 304, a gate structure 414 is formed in the second region 405b. In some embodiments, another gate structure 414 can be formed in the third region 405c in the operation 304. The gate structure 414 may include a gate dielectric layer, a gate conductive layer and a spacer. In some embodiments, the gate dielectric layer may include silicon oxide, silicon nitride, silicon oxy-nitride, or a high-k dielectric. High-k dielectrics comprise certain metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and combinations thereof. The gate dielectric layer may be formed using a suitable process such as ALD, CVD, PVD, thermal oxidation, UV-ozone oxidation, or a combination thereof. In some embodiments, the gate dielectric layer may further include an interfacial layer (IL) (not shown) to reduce damage to the gate dielectric layer and the substrate 402. In some embodiments, the gate conductive layer may include a semiconductor layer. In other embodiments, the gate conductive layer may include a work function metal layer and a gap-filling metal layer, but the disclosure is not limited thereto.

The spacer is formed over sidewalls of the gate conductive layer and the gate dielectric layer. The spacer can be formed by various processes, including a deposition process and an etching process. Because operations for forming the gate dielectric layer, the gate conductive layer and the spacer are familiar to those skilled in the art, details thereof are omitted for brevity.

Figure 7:
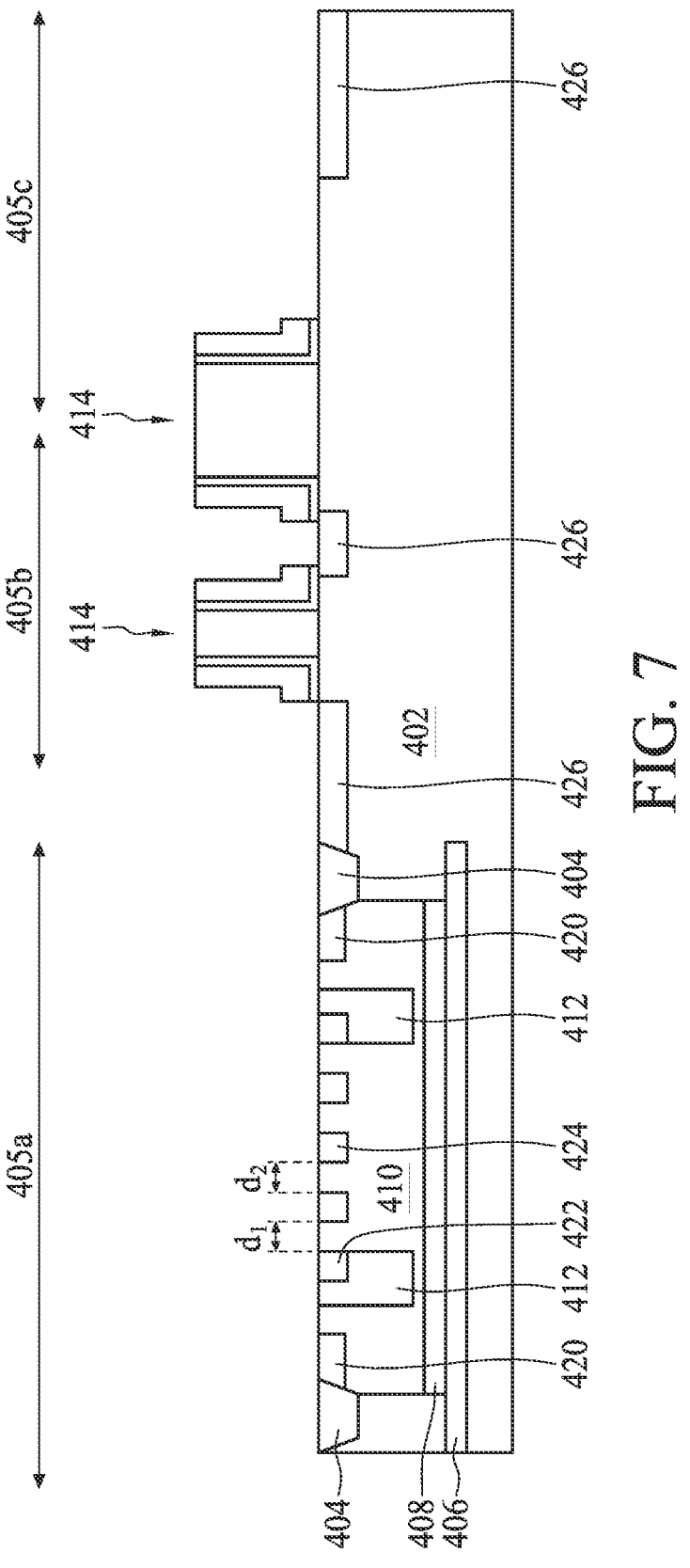

Referring to FIG. 7, in some embodiments, in operation 203 and operation 305, a plurality of doped regions are formed in the first region 405a. In some embodiments, the doped regions formed in the first region 405a further include a doped region 420 formed in the first drift region 410, a doped region 422 formed in the second drift region 412, and a doped region 424 in the first drift region 410. The doped region 420 includes the first conductivity type, and the doped regions 422 and 424 include the second conductivity type. In some embodiments, a concentration of the doped region 420 is greater than a concentration of the first drift region 410, and concentrations of the doped regions 422 and 424 are greater than a concentration of the second drift region 412. Additionally, the concentration of the doped region 422 and the concentrations of the doped regions 424 are equal. In such embodiments, the doped region 420 may be referred to as a heavily-doped n-type (n+) region, and the doped regions 422 and 424 may be referred to as heavily-doped p-type (p+) regions.

In some embodiments, the doped region 420 formed in the first drift region 410 may have a ring shape, but the disclosure is not limited thereto. In some embodiments, the doped region 422 formed in the ring-shaped second drift region 412 may have a ring shape, but the disclosure is not limited thereto. As shown in FIG. 7, the doped region 420 is separated from the doped regions 422 and 424 by the first drift region 410 and the second drift region 412. The doped region 422 is separated from the doped region 424 by the first drift region 410. The doped regions 424 are separated from each other by the first drift region 410. In some embodiments, a distance d1 between the adjacent doped regions 422 and 424 is equal to a distance d2 between the adjacent doped regions 424, but the disclosure is not limited thereto. In some embodiments, a depth of the doped region 420, a depth of the doped region 422 and depths of the doped regions 424 are equal, but the disclosure is not limited thereto.

Additionally, in operation 305, a source/drain region 426 is formed in the second region 405*b*. In some embodiments, a source/drain region 426 can be formed in the third region 405*c* in the operation 305. The source/drain region 426 may refer to a source region or a drain region, individually or collectively depending upon the context. In some embodiments, the operation 203 and the operation 305 indicate that the methods 20 and 30 can be easily integrated into operations for forming source/drain regions in a MOS manufacturing process.

Figure 8:
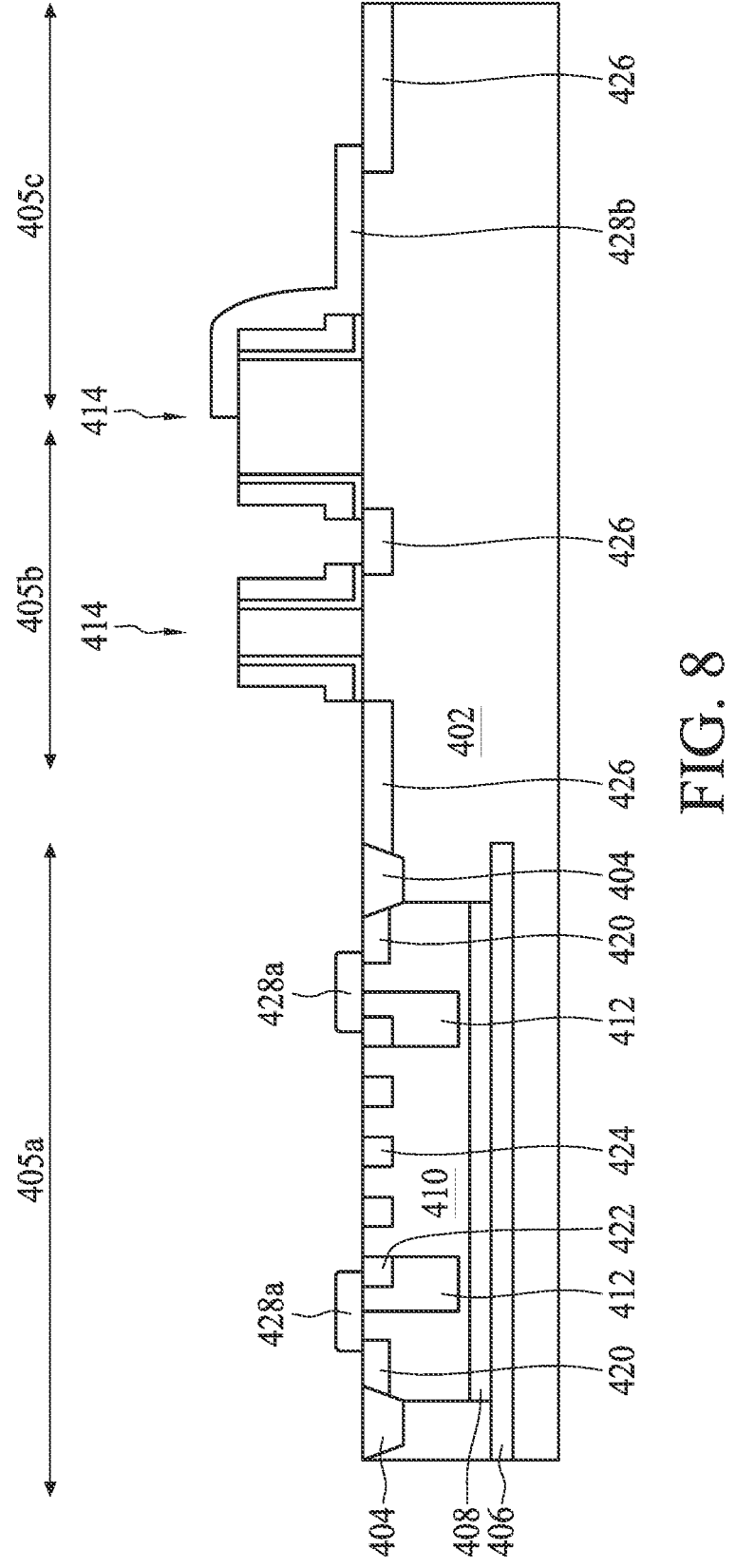

Referring to FIG. 8, in operation 204, an isolation structure is formed over the substrate 402. In some embodiments, the operation 204 can include further operations. In some embodiments, the operation 204 may include operation 306. In such embodiments, dielectric layers 428*a* and 428*b* are formed over the substrate 402. The dielectric layers 428*a* and 428*b* can be formed by suitable deposition and patterning operations. Consequently, the dielectric layer 428*a* is formed in the first region 405*a*, and the dielectric layer 428*b* is formed in the second region 405*b* and/or the third region 405*c*. In some embodiments, the dielectric layer 428*a* is formed over a portion of the doped region 420, a portion of the first drift region 410, a portion of the second drift region 412 and a portion of the doped region 422, as shown in FIG. 8. In some embodiments, the dielectric layer 428*a* has a ring shape covering the portion of the ring-shaped doped region 420, the portion of the ring-shaped second drift region 412, and the portion of the ring-shaped doped region 422. In such embodiments, the dielectric layer 428*a* is separated from the ring-shaped isolation structure 404. In some embodiments, the dielectric layer 428*b* in the second region 405*b* and/or the third region 405*c* covers a portion of the gate structure 414, as shown in FIG. 8, but the disclosure is not limited thereto.

In some embodiments, the dielectric layers 428*a* and 428*b* include a resist protective oxide, but the disclosure is not limited thereto.

Figure 9:
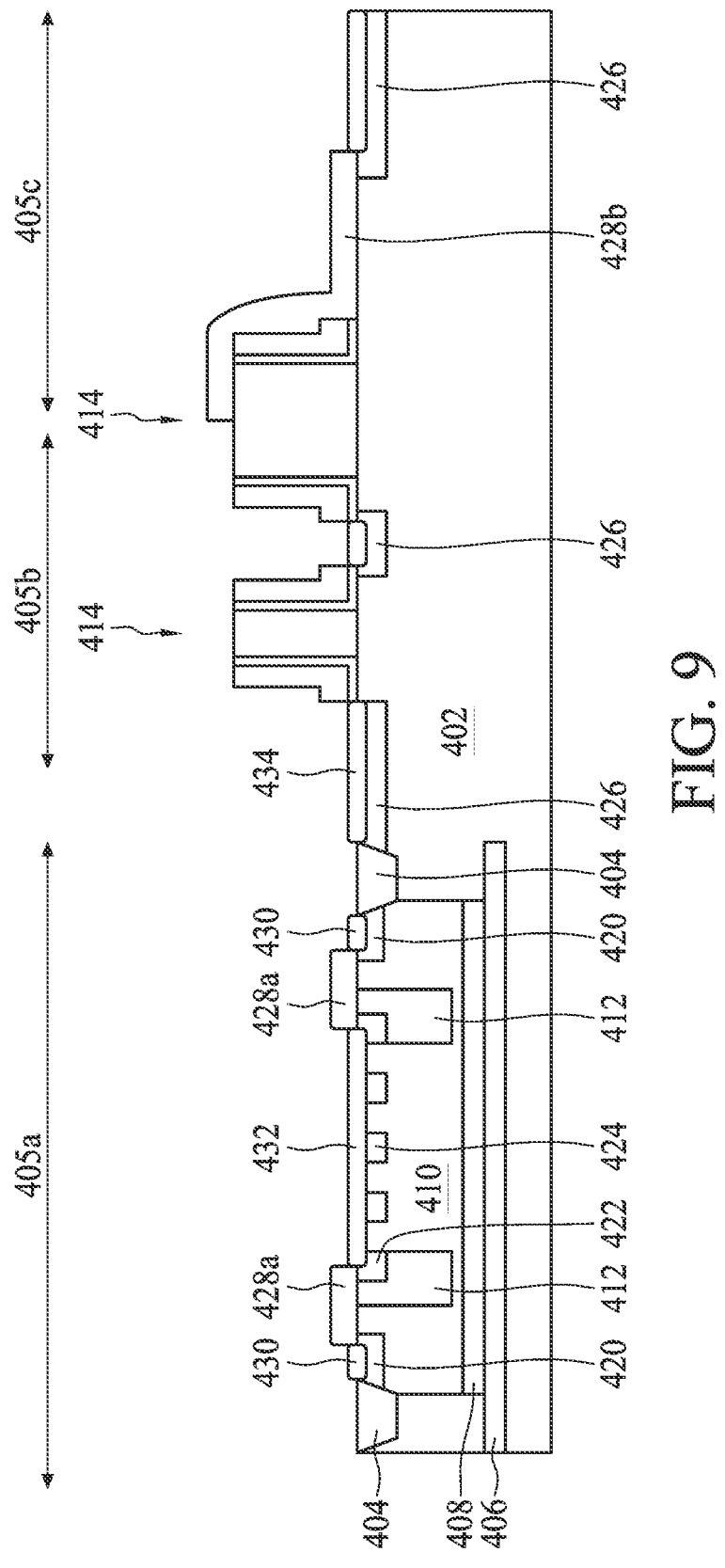

Referring to FIG. 9, in some embodiments, a plurality of silicide layers 430, 432 and 434 are formed over the substrate 402. In some embodiments, the silicide layer 430 is formed on the doped region 420, and the silicide layer 432 is formed on the doped regions 422 and 424 and the first drift region 410 in the first region 405*a*. Further, the silicide layer 434 is formed on the source/drain region 426 in the second and third regions 405*b* and 405*c*. In some embodiments, the silicide layer 430 on the ring-shaped doped region 420 obtains a ring shape. The silicide layer 432 electrically connects the doped region 422, the doped regions 424 and the first drift region 410.

Figure 10:
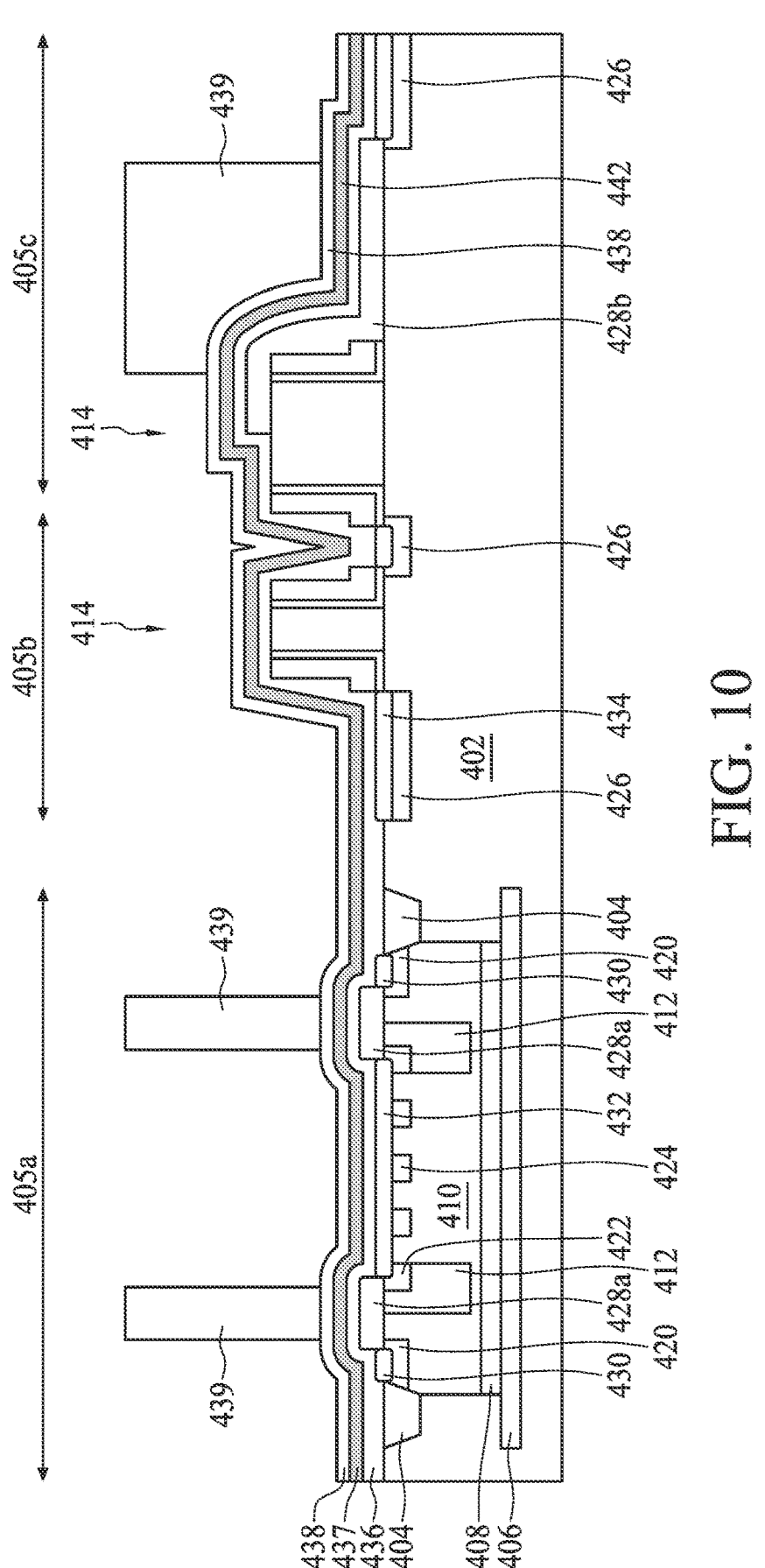

Referring to FIG. 10, in some embodiments, the operation 204 includes further operations, for example, forming another dielectric layer 436 on the substrate 402. The dielectric layer 436 covers and is in contact with a top surface and sidewalls of the dielectric layers 428*a* and 428*b*. Further, the dielectric layer 436 covers and is in contact with the silicide layers 430, 432 and 434. The dielectric layer 436 includes materials different from that of the dielectric layers 428*a* and 428*b*. In some embodiments, a sum of a thickness of the dielectric layer 428*a* and a thickness of the dielectric layer 436 may be between approximately 50 nanometers and approximately 150 nanometers, but the disclosure is not limited thereto. In some embodiments, the dielectric layer 428*a* and the dielectric layer 436 in the first region 405*a* are referred to as an isolation structure, which is formed in operation 204. Additionally, a sum of a thickness of the isolation structure (including the dielectric layer 428*a* and the dielectric layer 436) is less than a height of the gate structure 414.

Still referring to FIG. 10, in operation 205, a metal field plate is formed over the isolation structure. In some embodiments, the operation 205 includes further operations. For example, the operation 205 may include operation 307. In such embodiments, a metal layer 437 is formed over the substrate 402. As shown in FIG. 10, the metal layer 437 is blanketly formed in the regions 405*a*, 405*b* and 406*c*. Further, the metal layer 437 is separated from the dielectric layers 428*a* and 428*b* by the dielectric layer 436. In some embodiments, the metal layer 437 may include Ti, TiN, Ta, TaN, Co, Al, W, Ni, but the disclosure is not limited thereto. A thickness of the metal layer 437 may be between approximately 1 nanometers and approximately 100 nanometers, but the disclosure is not limited thereto. Still referring to FIG. 10, another dielectric layer 438 is formed over the metal layer 437, and a patterned photoresist layer 439 is formed over the dielectric layer 438. In some embodiments, the dielectric layer 438 includes a material same as that of the dielectric layer 436, but the disclosure is not limited thereto. In some embodiments, a thickness of the dielectric layer 438 and a thickness of the dielectric layer 436 are equal, but the disclosure is not limited thereto.

Figure 11:
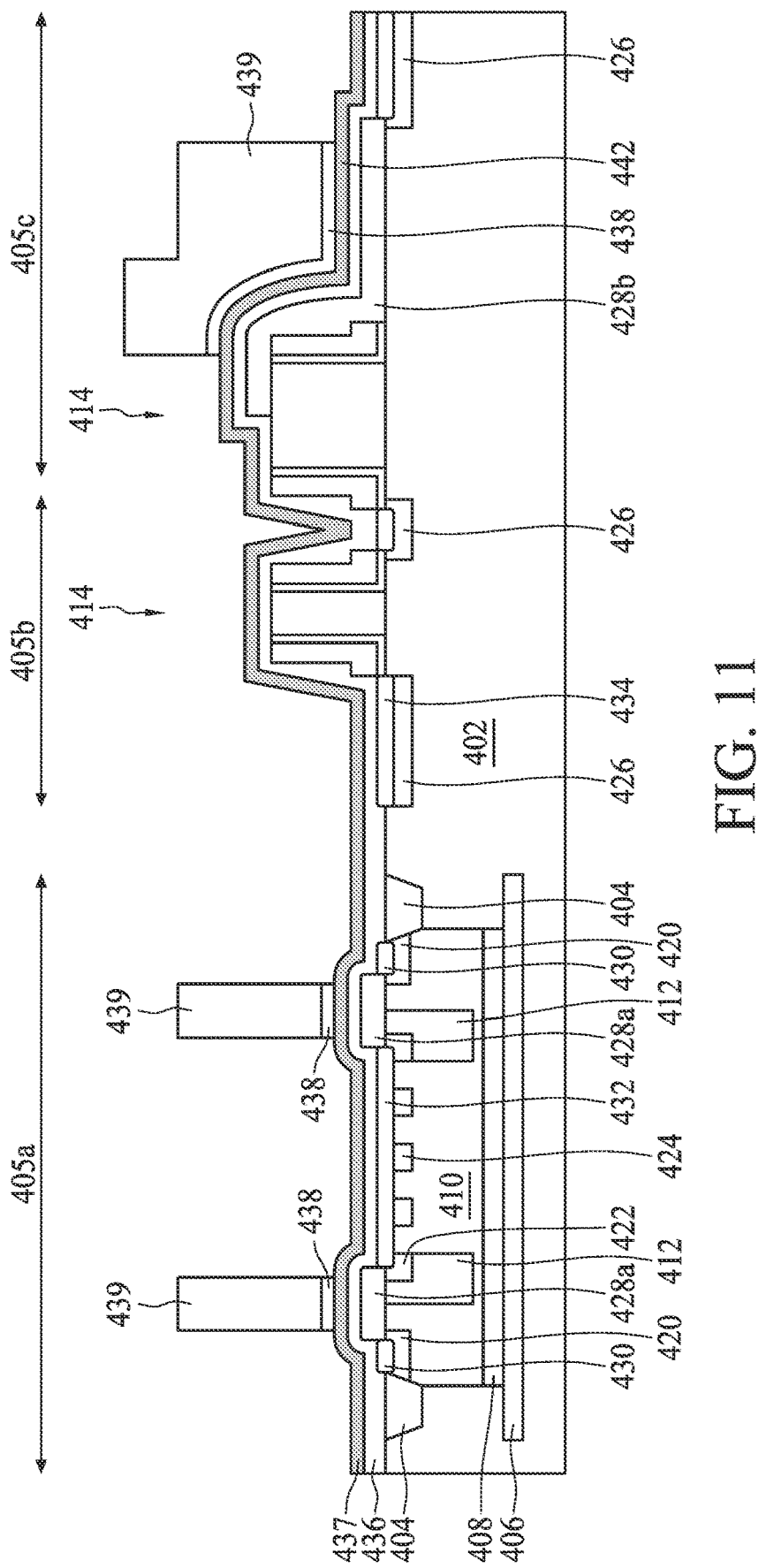

Referring to FIG. 11, in some embodiments, the operation 205 further includes removing portions of the dielectric layer 438 through the patterned photoresist layer 439. In such embodiments, a suitable etching operation is performed on the dielectric layer 438. Thus, the portions of the dielectric layer 438 exposed through the patterned photoresist layer 439 are removed. In some embodiments, the remaining dielectric layer 438 may serve as a patterned hard mask layer over the metal layer 437.

Figure 12:
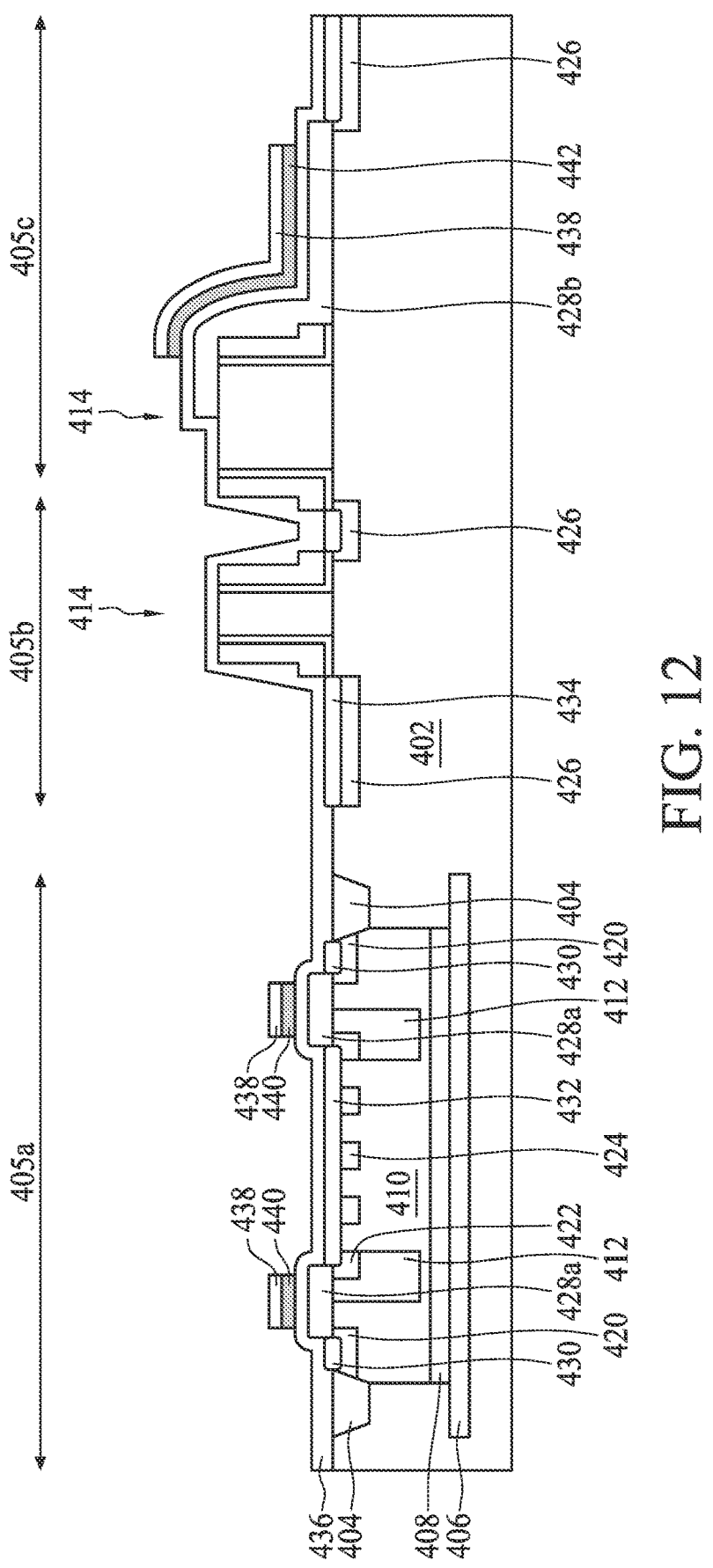

Referring to FIG. 12, in some embodiments, the operation 205 further includes operation 308. In such embodiments, portions of the metal layer 437 are removed through the patterned dielectric layer 438. Accordingly, a plurality of metal field plates 440 and 442 are formed over the substrate 402. As shown in FIG. 12, the metal field plate 440 is formed in the first region 405*a*. Further, the metal field plate 440 is formed over the isolation structure, which includes the dielectric layer 436 and the dielectric layer 428*a*. In some embodiments, the metal field plate 440 may have a ring shape, but the disclosure is not limited thereto. In some embodiments, the metal field plate 442 may be formed in the second region 405*b* or the third region 405*c*, as shown in FIG. 12. In such embodiments, the metal field plate 442 is separated from the gate structure 414 by the dielectric layer 436 and the dielectric layer 428*b*. However, in some alternative embodiments, the metal field plate 442 may be removed from the second region 405*b* or the third region 405*c*.

Figure 13:
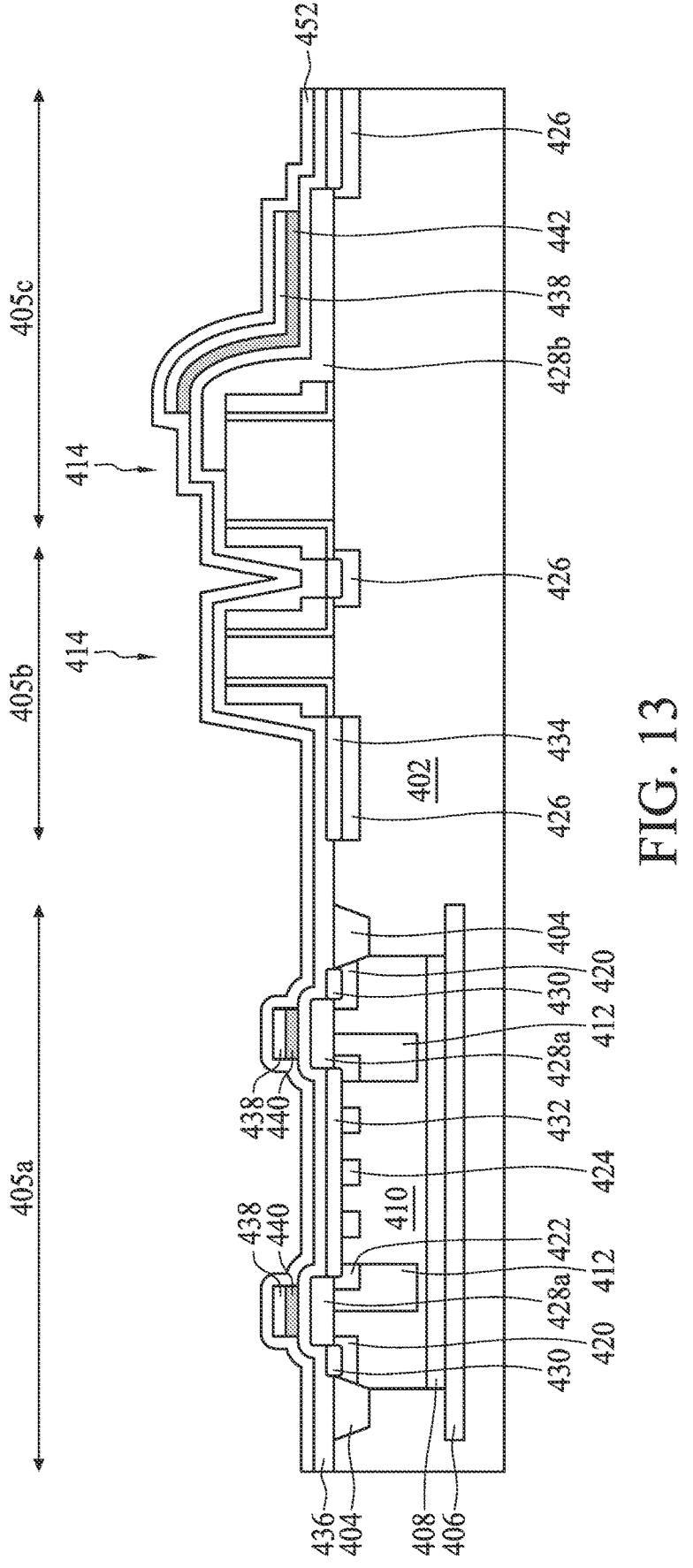
Figure 14:
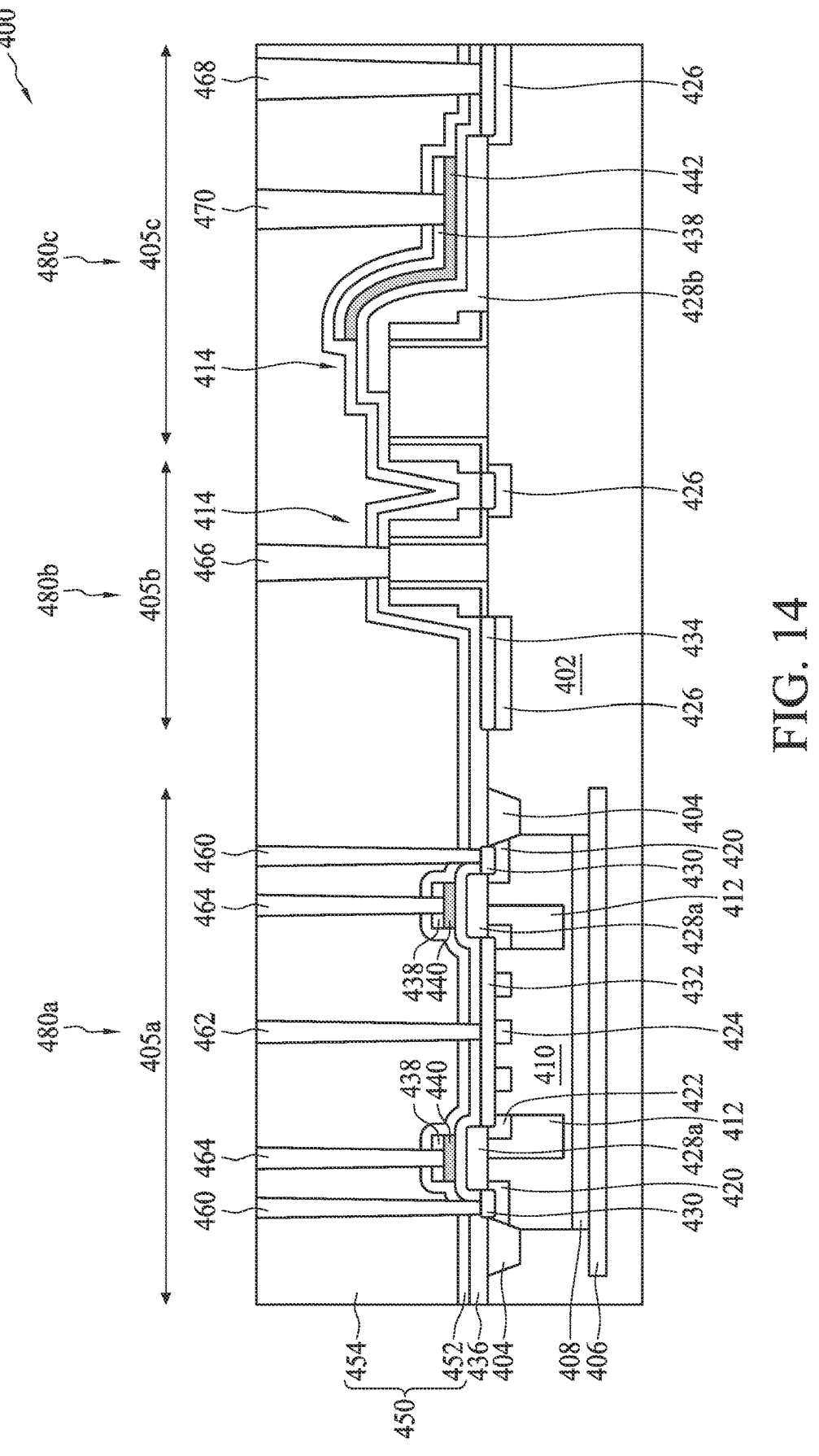

Referring to FIGS. 13 and 14, in some embodiments, a dielectric structure 450 is formed over the substrate 402. In some embodiments, the forming of the dielectric structure 450 includes further operations. For example, a CESL 452 is conformally formed over the substrate 402, as shown in FIG. 13. The CESL 452 may include material same as those mentioned above; therefore, details thereof are omitted for brevity.

Referring to FIG. 14, the forming of the dielectric structure 450 further includes forming an ILD layer 454 over the CESL 452. In some embodiments, the ILD layer 454 may include material same as those mentioned above; therefore, details thereof are omitted for brevity.

Still referring to FIG. 14, in some embodiments, a plurality of connecting plugs 460, 462, 464, 466, 468 and 470 are formed in the dielectric structure 450. In some embodiments, the forming of the connecting plugs 460 to 470 includes further operations. For example, a plurality of openings (not shown) are formed in the dielectric structure 450 by suitable etching operations. In such embodiments, the openings penetrate the ILD layer 454 and the CESL 452. Consequently, the dielectric layer 438 and the dielectric layer 436 are exposed through bottoms of the openings. In some embodiments, another etching operation is performed on the dielectric layer 438 and the dielectric layer 436, thereby exposing the metal field plates 440 and the silicide layers 430, 432 and 434. The openings are then filled with a conductive material, and a planarization, such as a CMP operation, is performed. Consequently, the connecting plugs 460, 462, 464, 466, 468 and 470 are formed.

As shown in FIG. 14, the connecting plugs 460, 462, 464, 466, 468 and 470 penetrate the dielectric structure 450 (i.e., the ILD layer 454 and the CESL 452). The connecting plug 460 is in contact with the silicide layer 430 and is electrically connected to the doped region 420 through the silicide layer 430. The connecting plug 462 is in contact with the silicide layer 432 and thus is electrically connected to the doped region 422, the first drift region 410 and the doped regions 424 through the silicide layer 432. In some embodiments, the connecting plug 460 electrically connects the doped region 420 to a cathode, while the connecting plug 462 electrically connects the doped region 422, the first drift region 410 and the doped regions 424 to an anode. The connecting plug 464 penetrates the dielectric layer 438 and is in contact with the metal field plate 440. In some embodiments, the connecting plug 464 electrically connects the metal field plate 440 to a voltage.

In the second region 405*b* and the third region 405*c*, the connecting plug 466 is electrically connected to the gate structure 414, and the connecting plug 468 is electrically connected to the source/drain region 426 through the silicide layer 434. In some embodiments, the connecting plug 470 penetrates the dielectric layer 438 to contact the metal field plate 442.

Accordingly, a semiconductor structure 400 including a Schottky diode 480*a* is obtained. As shown in FIG. 14, the Schottky diode 480*a* is formed in the first region 405*a*, and may be formed by the method 20 or the method 30. In some embodiments, the semiconductor structure 400 further includes other devices. For example, the semiconductor structure 400 may include a MOS device 480*b* in the second region 405*b*. In some embodiments, the MOS device 480*b* may be a part of a CMOS device, but the disclosure is not limited thereto. In some embodiments, the semiconductor structure 400 may include another MOS device 480*c* in the third region 405*c*. In some embodiments, the MOS device 480*c* may be a DMOS, but the disclosure is not limited thereto.

According to one embodiment of the present disclosure, a semiconductor structure including a Schottky diode is provided. In some embodiments, the Schottky diode includes a metal field plate that is able to reduce surface electric fields. Due to the reduced surface electric field, a breakdown voltage of the Schottky diode is increased. Further, due to the metal field plate, a full depletion region can be formed before the surface electric field exceeds a critical field. Therefore, an area occupied by the Schottky diode can be reduced, and an on-resistance is reduced.

According to one embodiment of the present disclosure, a Schottky diode is provided. The Schottky diode includes a substrate, a first drift region in the substrate, a second drift region in the substrate, a first dielectric layer disposed over the substrate, a first doped region in the first drift region, a second doped region in the second drift region, a third doped region in the first drift region, and a metal field plate disposed over the first dielectric layer. The first drift region and the first doped region include a first conductivity type. The second drift region, the second doped region and third doped region include a second conductivity type complementary to the first conductivity type. The first dielectric layer overlaps a portion of the first drift region and a portion of the second drift region. The second doped region is separated from the first doped region.

According to one embodiment of the present disclosure, a method for forming a Schottky diode is provided. The method includes following operations. A first buried layer and a second buried layer are formed in a substrate. The first buried layer includes a first conductivity type, and the second buried layer includes a second conductivity type complementary to the first conductivity type. A first drift region and a second drift region are formed in the substrate over the first and second buried layers. The first drift region includes the first conductivity type, and the second drift region includes the second conductivity type. A first doped region is formed in the first drift region, a second doped region is formed in the second drift region, and a third doped region is formed in the first drift region. The first doped region includes the first conductivity type, and the second and third doped regions include the second conductivity type. An isolation structure is formed over the substrate. A metal field plate is formed over the isolation structure.

According to one embodiment of the present disclosure, a method for forming a semiconductor structure including a Schottky diode is provided. The method includes following operations. A substrate is provided. The substrate includes a first region and a second region. A first buried layer and a second buried layer are formed in the first region, and a well region is formed in the second region. A first drift region and a second drift region are formed in the first region. A gate structure is formed in the second region. A plurality of first doped regions are formed in the first region, and a source/drain region is formed in the second region. A first dielectric layer is formed in the first region, and a second dielectric layer is formed over the gate structure in the second region. A third dielectric layer is formed over the substrate. A metal layer is formed over the third dielectric layer. Portions of the metal layer are removed to form a plurality of metal field plates. Portions of the third dielectric layer are exposed through the metal field plates.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a Schottky diode, comprising:
forming a first buried layer and a second buried layer in a substrate, wherein the first buried layer comprises a first conductivity type, and the second buried layer comprises a second conductivity type complementary to the first conductivity type;
forming a first drift region comprising the first conductivity type and a second drift region comprising the second conductivity type in the substrate and over the first buried layer and the second buried layer;
forming a first doped region, comprising the first conductivity type, in the first drift region; a second doped region, comprising the second conductivity type, in the second drift region; and a third doped region, comprising the second conductivity type, in the first drift region;
forming an isolation structure over the substrate, wherein the forming of the isolation structure further comprises:
forming a first dielectric layer on the substrate; and
forming a second dielectric layer on the first dielectric layer, wherein the second dielectric layer is in contact with a top surface and sidewalls of the first dielectric layer and the substrate; and
forming a metal field plate over the isolation structure.

2. The method of claim 1, further comprising forming a first silicide layer over the first doped region and a second silicide layer over the second and third doped regions.

3. The method of claim 1, wherein the forming of the metal field plate further comprises:
forming a metal layer over the substrate;
forming a third dielectric layer over the metal layer; and
patterning the third dielectric layer and the metal layer to form the metal field plate over the isolation structure and a patterned third dielectric layer over the metal field plate.

4. The method of claim 1, further comprising:
forming a dielectric structure over the substrate; and
forming a first connecting plug electrically connected to the first doped region, a second connecting plug electrically connected to the second doped region and the third doped regions, and a third connecting plug electrically connected to the metal field plate.

5. The method of claim 1, wherein a concentration of the second doped region and a concentration of the third doped region are equal.

6. The method of claim 4, wherein the forming of the dielectric structure further comprising forming an etch stop layer and forming an interlayer dielectric (ILD) over the etch stop layer.

7. A method for forming a semiconductor structure including a Schottky diode, comprising:

receiving a substrate having a first region and a second region;
forming a first buried layer and a second buried layer in the first region and forming a well region in the second region;
forming a first drift region and a second drift region in the first region;
forming a gate structure in the second region;
forming a plurality of doped regions in the first region and a source/drain region in the second region;
forming a first dielectric layer in the first region;
forming a metal layer over the first dielectric layer;
forming a second dielectric layer over the metal layer; and
patterning the second dielectric layer and the metal layer to form a metal field plate over the first dielectric layer and a patterned second dielectric layer over the metal field plate.

8. The method of claim 7, further comprising forming a plurality of first silicide layers over the doped regions in the first region and a second silicide layer over the source/drain region in the second region.

9. The method of claim 7, wherein the doped regions comprise:
a first doped region in the first drift region;
a second doped region in the second drift region; and
a third doped region in the first drift region,
wherein the first buried layer, the first drift region and the first doped region comprise a first conductivity type, and the second buried layer, the second drift region, the second doped region and the third doped region comprise a second conductivity type complementary to the first conductivity type.

10. The method of claim 7, wherein a width of the metal field plate in the first region is equal to or less than a width of the first dielectric layer in the first region.

11. The method of claim 7, further comprising:
forming a dielectric structure over the substrate; and
forming a plurality of first connecting plugs electrically connected to the doped regions, and a second connecting plug electrically connected to the metal field plate.

12. The method of claim 11, further comprising forming a third connecting plug electrically connected to the gate structure.

13. A method for forming a semiconductor structure including a Schottky diode, comprising:
receiving a substrate having a first region and a second region;
forming a first buried layer and a second buried layer in the first region;
forming a first drift region and a second drift region in the first region;
forming a gate structure in the second region;
forming a plurality of doped regions in the first region and a source/drain region in the second region;
forming a first dielectric layer in the first region and a second dielectric layer in the second region, wherein the second dielectric layer covers a portion of the gate structure and a portion of the source/drain region; and
forming a first metal field plate over the first dielectric layer and a second metal field plate over the second dielectric layer.

14. The method of claim 13, wherein the doped regions comprise:
a first doped region in the first drift region;
a second doped region in the second drift region; and
a third doped region in the first drift region,

wherein the first buried layer, the first drift region and the first doped region comprise a first conductivity type, and the second buried layer, the second drift region, the second doped region and the third doped region comprise a second conductivity type complementary to the first conductivity type.

15. The method of claim 13, further comprising forming a plurality of first silicide layers over the doped regions in the first region, and a second silicide layer over the source/drain region in the second region.

16. The method of claim 13, wherein a width of the first metal field plate is equal to or less than a width of the first dielectric layer.

17. The method of claim 13, wherein a width of the second metal field plate is equal to or less than a width of the second dielectric layer.

18. The method of claim 13, further comprising:
forming a dielectric structure over the substrate; and
forming a plurality of first connecting plugs electrically connected to the doped regions, and a second connecting plug electrically connected to the first metal field plate.

19. The method of claim 18, further comprising forming a third connecting plug electrically connected to the source/drain region, and a fourth connecting plug electrically connected to the second metal field plate.

20. The method of claim 13, wherein the forming of the first metal field plate and the second metal field plate further comprises:
forming a third dielectric layer over the first dielectric layer, the second dielectric layer and the gate structure;
forming a metal layer over the third dielectric layer; and
removing portions of the metal layer to form the first metal field plate and the second metal field plate, and to expose the third dielectric layer.

*    *    *    *    *